US009209239B2

(12) United States Patent
Kwak et al.

(10) Patent No.: US 9,209,239 B2
(45) Date of Patent: Dec. 8, 2015

(54) METHOD OF FABRICATING SEMICONDUCTOR DEVICE

(71) Applicant: SK hynix Inc., Icheon (KR)

(72) Inventors: Eun Hye Kwak, Seoul (KR); Hyeong Uk Yun, Icheon (KR)

(73) Assignee: SK Hynix Inc., Icheon (KR)

( * ) Notice: Subject to any disclaimer, the term of this patent is extended or adjusted under 35 U.S.C. 154(b) by 219 days.

(21) Appl. No.: 13/718,663

(22) Filed: Dec. 18, 2012

(65) Prior Publication Data

US 2014/0015100 A1    Jan. 16, 2014

(30) Foreign Application Priority Data

Jul. 13, 2012 (KR) .................. 10-2012-0076955

(51) Int. Cl.
*H01L 49/02* (2006.01)
(52) U.S. Cl.
CPC ............... *H01L 28/60* (2013.01); *H01L 28/75* (2013.01); *H01L 28/91* (2013.01); *H01L 28/92* (2013.01)
(58) Field of Classification Search
CPC ......... H01L 28/60; H01L 28/75; H01L 28/91; H01L 28/92
See application file for complete search history.

(56) References Cited

U.S. PATENT DOCUMENTS

| 6,563,157 | B2 * | 5/2003 | Fukuzumi | 257/296 |
| 6,994,611 | B2 * | 2/2006 | Svirchevski et al. | 451/56 |
| 8,421,140 | B2 * | 4/2013 | Sandhu et al. | 257/310 |
| 8,466,052 | B2 * | 6/2013 | Baek et al. | 438/589 |
| 8,648,441 | B2 * | 2/2014 | Hijioka et al. | 257/532 |
| 8,697,579 | B2 * | 4/2014 | Park et al. | 438/700 |
| 2002/0102791 | A1 * | 8/2002 | Kurasawa et al. | 438/240 |
| 2011/0121377 | A1 * | 5/2011 | Jin | 257/301 |
| 2011/0163415 | A1 * | 7/2011 | Park | 257/532 |

FOREIGN PATENT DOCUMENTS

KR   10-2005-0067483 A   7/2005
KR   10-2006-0074989 A   7/2006

* cited by examiner

*Primary Examiner* — Ermias Woldegeorgis
*Assistant Examiner* — Benjamin Tzu-Hung Liu

(57) ABSTRACT

The method includes forming a metal interconnection layer and a first interlayer insulating layer on a semiconductor substrate, forming a reservoir capacitor region by etching the first interlayer insulating layer to expose the metal interconnection layer, forming a barrier metal layer on the reservoir capacitor region, forming a sacrificial insulating layer on the barrier metal layer in a lower portion of the reservoir capacitor region, performing a pre-cleaning process to remove the barrier metal layer on a sidewall of the reservoir capacitor region, and removing the sacrificial insulating layer.

16 Claims, 5 Drawing Sheets

METHOD OF FABRICATING SEMICONDUCTOR DEVICE

CROSS-REFERENCES TO RELATED APPLICATION

This application claims priority under 35 U.S.C. 119(a) to Korean application number 10-2012-0076955, filed on 13 Jul. 2012, in the Korean Patent Office, which is incorporated by reference in its entirety.

BACKGROUND OF THE INVENTION

1. Technical Field

The present invention relates to a semiconductor device, and more particularly, to a method of fabricating a semiconductor device.

2. Related Art

Semiconductor memory devices, which store information such as data or program commands, are classified into dynamic random access memories (DRAMs) and static random access memories (SRAMs). DRAMs are memory devices which read or write information therein and store information therein. Although the DRAMs read/write information therefrom/therein, data stored in the DRAMs is lost when the information is not periodically rewritten within a given time period. DRAMS are required to be continuously refreshed, but have been widely used because it is possible to produce them at a low cost per memory cell and with a high degree of integration.

Typically, one memory device, that is, one memory cell, includes a transistor and a capacitor. The capacitor has a structure in which a dielectric layer is interposed between two electrodes. Capacitance of the capacitor is proportional to a dielectric constant of the dielectric layer and an electric surface area of an electrode and inversely proportional to a space between electrodes, that is, a thickness of the dielectric layer. Various methods have been suggested to fabricate a high capacitance capacitor. Such methods include using a dielectric material having a high dielectric constant, reducing a thickness of the dielectric layer, increasing a surface area of a lower electrode, or reducing a space between electrodes.

However, as the dimensions of a device are gradually reduced due to an increase in the degree of integration of the semiconductor memory device, it becomes difficult to ensure a sufficient surface area of the lower electrode. In addition, although it is possible to increase the dielectric constant to increase the capacitance of the capacitor, an increase in the dielectric constant is limited without also increasing the electrode's surface area. Thus, research on improvements in the structure of a lower electrode has continuously progressed and a three-dimensional (3D) concave type or a cylinder type capacitor has been developed to increase the electrode surface area.

Various levels of power are required to operate a capacitor in a cell area and other components in other areas including the peripheral circuit area. However, noise is accompanied by the power supplied to operate the capacitor. A reservoir capacitor is used to remove the noise. Reservoir capacitors are simultaneously formed in areas, including a peripheral circuit area, when transistors are formed in the cell area. At this time, many reservoir capacitors are formed in various areas in the semiconductor device. However, if the number of reservoir capacitors increases, and the degree of integration of the semiconductor device increases, an electric short between adjacent reservoir capacitors or between a reservoir capacitor and an underlying metal interconnection may occur. A semiconductor device or a method of manufacturing the same that prevents such problems is necessary.

SUMMARY

One or more exemplary embodiments are directed to a method of fabricating a semiconductor device capable of preventing a metal interconnection below a reservoir capacitor from being shorted and preventing the semiconductor from being degraded due to removal of a barrier metal layer below a reservoir capacitor in a pre-cleaning process of a reservoir capacitor fabrication process.

According to one aspect of an exemplary embodiment, there is provided a method of fabricating a semiconductor device. The method may include: forming a metal interconnection layer and a first interlayer insulating layer over a semiconductor substrate; forming a trench for a reservoir capacitor by etching the first interlayer insulating layer to expose the metal interconnection layer; forming a barrier metal layer over an inner surface of the trench; forming a sacrificial insulating layer over the barrier metal layer in a lower portion of the trench; performing a cleaning process to remove the barrier metal layer exposed at a sidewall of the trench; and removing the sacrificial insulating layer.

The method may further include forming an insulating layer for capacitor support and a second interlayer insulating layer over the first interlayer insulating layer.

The first interlayer insulating layer may include any of tetra ethyl ortho silicate (TEOS) and phospho silicate glass (PGS).

The barrier metal layer may include titanium (Ti).

The sacrificial insulating layer may include spin on carbon (SOC).

The forming a sacrificial insulating layer on the barrier metal layer in a lower portion of the reservoir capacitor region may include filling the sacrificial insulating layer in the trench and performing an etch back process on the sacrificial insulating layer.

The performing an etch back process may include etching back the sacrificial insulating layer so that an upper surface of the sacrificial insulating layer is located higher than an upper surface of the metal interconnection.

The performing a cleaning process to remove the exposed barrier metal layer at the sidewall of the trench may include performing the cleaning process to prevent the barrier metal layer covered by the sacrificial insulating layer from being removed.

The cleaning process may be performed using a solution having a composition of $NH_4OH:H_2O_2:DI=1:4:20$.

The removing the sacrificial insulating layer may include performing a strip process.

The method may further include forming a lower electrode over the barrier metal layer in the trench and the first interlayer insulating layer after the removing the sacrificial insulating layer.

The lower electrode may include titanium nitride (TiN).

According to the other aspect of an exemplary embodiment, there is provided a method of fabricating a semiconductor device. The method may include: providing a semiconductor substrate including a metal interconnection layer; forming a first interlayer insulating layer over the metal interconnection layer; patterning the first interlayer insulating layer to form a trench; forming a barrier metal pattern in a lower portion of the trench; and forming a lower electrode of a reservoir capacitor, wherein the lower electrode is isolated from the metal interconnection layer, and wherein the barrier metal pattern is configured to couple the lower electrode to the metal interconnection layer.

The lower electrode and the metal interconnection layer may be coupled to each other through the barrier metal pattern in any of an electrical, a magnetic, and an electro-magnetic manner.

The barrier metal pattern extends up to a level higher than an upper surface of the metal interconnection layer.

The trench may be formed in a peripheral region of the semiconductor substrate.

The step of forming the barrier metal pattern in a lower portion of the trench comprising forming a barrier metal layer along a contour of an inner surface of the trench; filling a sacrificial insulating layer in the lower portion of the trench so that the barrier metal layer in the lower portion of the trench is covered by the sacrificial insulating layer; removing a portion of the barrier metal layer that is not covered by the sacrificial insulating layer to form the barrier metal pattern; and removing the sacrificial insulating layer.

The step of removing the barrier metal layer may be performed using a wet etching process.

According to one aspect of an exemplary embodiment, there is provided a semiconductor device. The semiconductor device may include: a metal interconnection layer provided over a substrate; an lower electrode of a reservoir capacitor provided over the metal interconnection layer; and a barrier metal pattern provided between the metal interconnection layer and the lower electrode, wherein the lower electrode is isolated from the metal interconnection, and wherein the barrier metal pattern is configured to couple the lower reservoir capacitor to the metal interconnection.

The barrier metal pattern may extend up to a level higher than an upper surface of the metal interconnection layer.

The lower electrode of the reservoir capacitor may be provided in a peripheral region of the semiconductor substrate.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
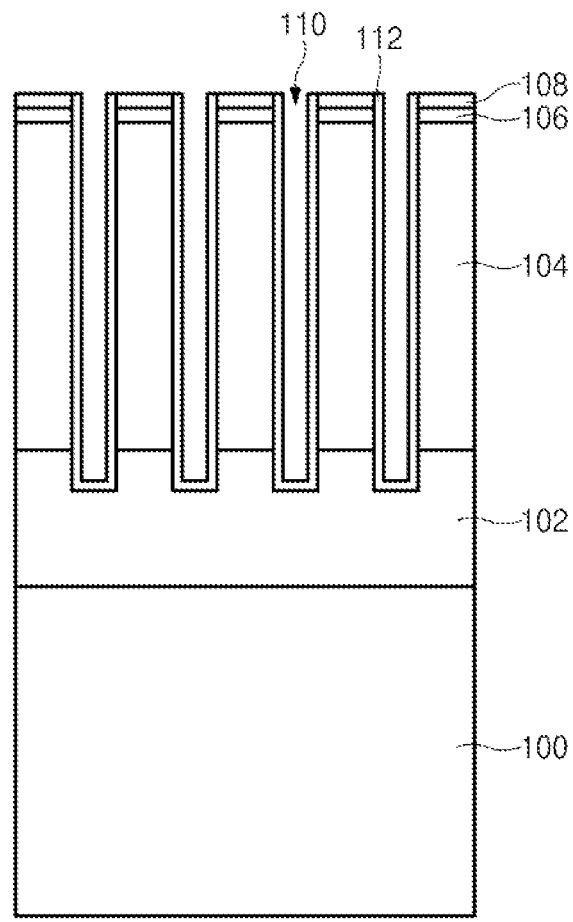
FIGS. 1A to 1E are cross-sectional views illustrating a method of fabricating a semiconductor device according to an exemplary embodiment of the present invention.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 1A to 1E are cross-sectional views illustrating a method of fabricating a semiconductor device according to an exemplary embodiment. Although not illustrated, a semiconductor device according to an exemplary embodiment may be formed in a peripheral circuit area.

As shown in FIG. 1A, a metal interconnection 102 is formed on a semiconductor substrate 100 and a first interlayer insulating layer 104 is formed over the semiconductor substrate 100 including the metal interconnection 102. Subsequently, an insulating layer 106 for capacitor support and a second interlayer insulating layer 108 are formed on the first interlayer insulating layer 104. The first interlayer insulating layer 104 may include tetra ethyl ortho silicate (TEOS) or phospho silicate glass (PSG). The insulating layer 106 for capacitor support may include a nitride floating capacitor (NFC).

Subsequently, the second interlayer insulating layer 108, the insulating layer 106 for capacitor support, and the first interlayer insulating layer 104 are etched to expose the metal interconnection 102, thereby forming a trench 110 for a reservoir capacitor (also referred to as a reservoir capacitor region). A barrier metal layer 112 is applied along a contour of the trench 110. The barrier metal layer 112 may include titanium.

Figure 1B:
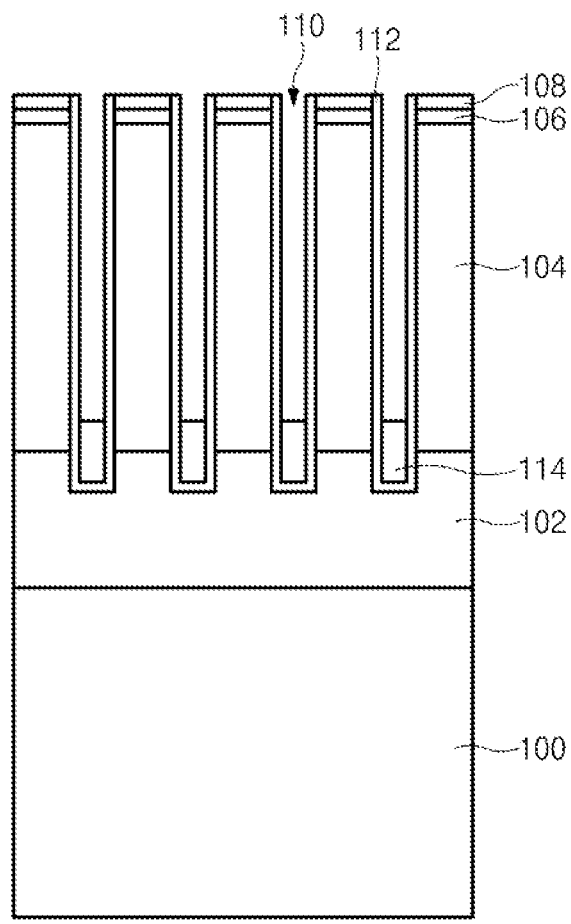

As shown in FIG. 1B, a sacrificial insulating layer 114 fills the trench 110 and is formed on the barrier metal layer 112. Then an etch-back process is performed on the sacrificial insulating layer 114. Therefore, the sacrificial insulating layer 114 remains in a lower portion of the trench 110 while a portion of the barrier metal layer 112 on a sidewall of the trench 110 is exposed. The sacrificial insulating layer 114 may include spin on carbon (SOC) and the sacrificial insulating layer 114 is etched back so that an upper surface level of the remaining sacrificial insulating layer 114 is higher than that of the metal interconnection 102.

Figure 1C:
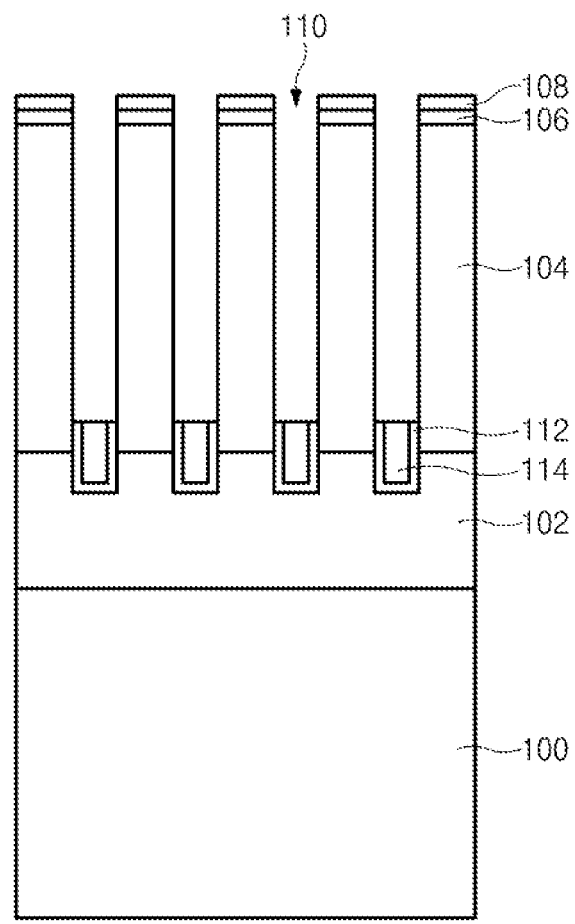

As shown in FIG. 1C, a pre-cleaning process is performed to remove the exposed barrier metal layer 112 on the sidewall of the trench 110. In the pre-cleaning process, the barrier metal layer 112 in the lower portion of the trench 110, covered by the sacrificial insulating layer 114, is not removed but remains. Here, the pre-cleaning process may be performed using a solution having a composition of $NH_4OH:H_2O_2$:DI=1:4:20.

Figure 1D:
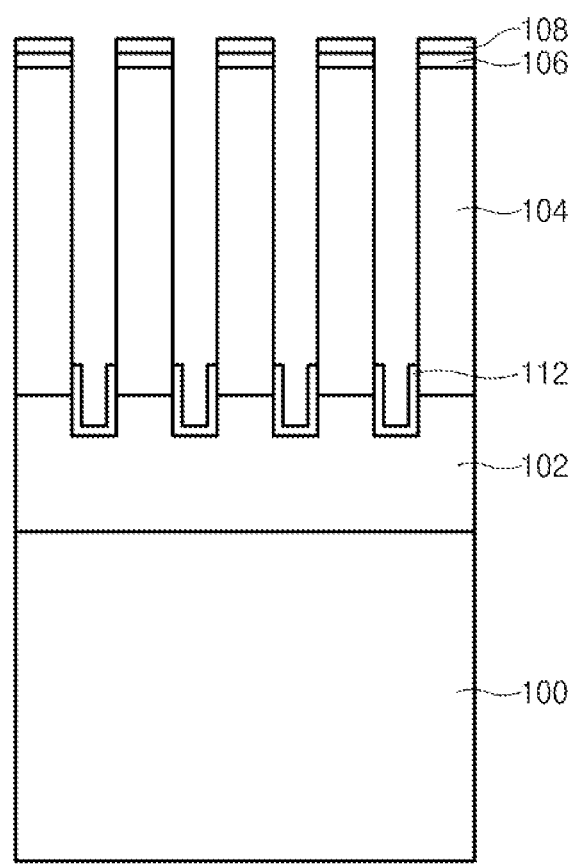

As shown in FIG. 1D, the sacrificial insulating layer 114 is removed. The sacrificial insulating layer 114 may be removed through a strip process.

Figure 1E:
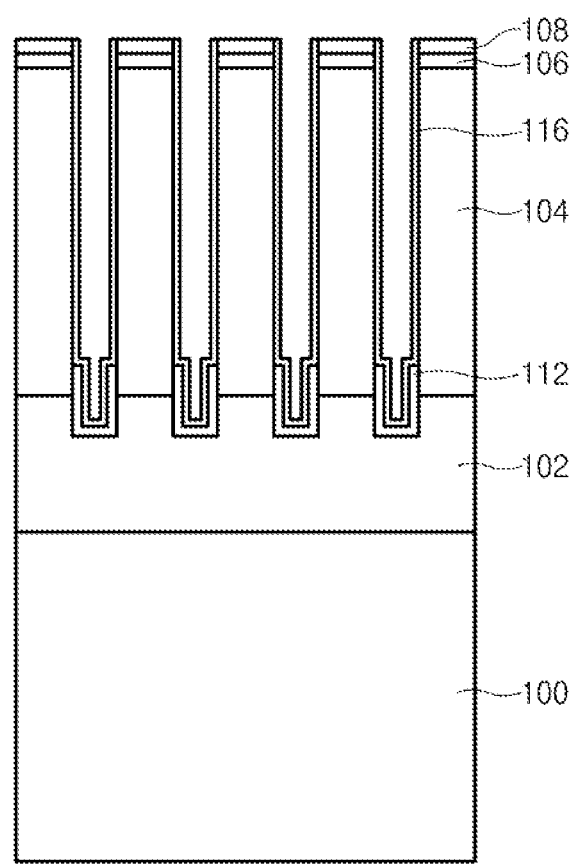

As shown in FIG. 1E, a lower electrode 116 is formed on the barrier metal layer 112, the first interlayer insulating layer 104, the insulating layer 106, and the second interlayer insulating layer 108 in the trench 110 for reservoir capacitor. The lower electrode may be formed of titanium nitride (TiN).

As described above, in a process of forming a reservoir capacitor according to an exemplary embodiment, the barrier metal layer 112 at a lower portion of the trench for reservoir capacitor is protected by the sacrificial insulating layer 114 during the pre-cleaning process so that loss of the metal interconnection below the reservoir capacitor is prevented and occurrence of an electric short of the metal interconnection located below the reservoir capacitor is prevented. Therefore, characteristics of the semiconductor device can be improved.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a semiconductor device, the method comprising:
    forming a metal interconnection layer, a first interlayer insulating layer, and an insulating layer for capacitor support over a semiconductor substrate;
    forming a trench for a reservoir capacitor by etching the insulating layer for capacitor support and the first interlayer insulating layer to expose the metal interconnection layer;
    forming a barrier metal layer over an inner surface of the trench;
    forming a sacrificial insulating layer over the barrier metal layer in a lower portion of the trench;
    performing a cleaning process to remove the barrier metal layer exposed at a sidewall of the trench so as to form a barrier metal pattern, a bottom of the insulating layer for capacitor support being disposed higher than each upper surface of the barrier metal pattern after the cleaning process is performed;
    removing the sacrificial insulating layer; and
    forming a lower electrode over the barrier metal pattern in the trench and an exposed sidewall of the first interlayer insulating layer after the removing the sacrificial insulating layer.

2. The method of claim 1, further comprising:
    forming a second interlayer insulating layer over the insulating layer for capacitor support.

3. The method of claim 1, wherein the first interlayer insulating layer includes any of tetra ethyl ortho silicate (TEOS) and phospho silicate glass (PGS).

4. The method of claim 1, wherein the barrier metal layer includes titanium (Ti).

5. The method of claim 1, wherein the sacrificial insulating layer includes spin on carbon (SOC).

6. The method of claim 1, wherein the forming a sacrificial insulating layer over the barrier metal layer in a lower portion of the trench includes:
    filling the sacrificial insulating layer in the trench; and
    performing an etch back process on the sacrificial insulating layer so that the sacrificial insulating layer remains in the lower portion of the trench.

7. The method of claim 6, wherein the performing an etch back process includes etching back the sacrificial insulating layer so that an upper surface of the sacrificial insulating layer is located higher than an upper surface of the metal interconnection layer.

8. The method of claim 1, wherein the performing a cleaning process to remove the exposed barrier metal layer at the sidewall of the trench includes:
    performing the cleaning process to prevent the barrier metal layer covered by the sacrificial insulating layer from being removed.

9. The method of claim 1, wherein the cleaning process is performed using a solution having a composition including $NH_4OHH_2O_2DI$, and
    wherein the ratio of $NH_4OH:H_2O_2:DI$ is 1:4:20.

10. The method of claim 1, wherein the removing the sacrificial insulating layer includes performing a strip process.

11. The method of claim 1, wherein the lower electrode may include titanium nitride (TiN).

12. The method of claim 1, wherein the lower electrode is isolated from the metal interconnection layer, and
    wherein the barrier metal pattern is configured to couple the lower electrode to the metal interconnection layer.

13. The method of claim 12, wherein the lower electrode and the metal interconnection layer are coupled to each other through the barrier metal pattern in any of an electrical, a magnetic, and an electro-magnetic manner.

14. The method of claim 13, wherein the barrier metal pattern extends up to a level higher than an upper surface of the metal interconnection layer.

15. The method of claim 12, wherein the trench is formed in a peripheral region of the semiconductor substrate.

16. The method of claim 1, wherein removing the portion of the barrier metal layer is performed using a wet etching process.

* * * * *